United States Patent [19]

Rauscher

[11] Patent Number: 4,870,295

[45] Date of Patent: Sep. 26, 1989

[54] PHOTOCONDUCTIVE CIRCUIT ELEMENT PULSE GENERATOR

[75] Inventor: Christen Rauscher, Alexandria, Va.

[73] Assignee: The United States of America as represented by the United States Department of Energy, Washington, D.C.

[21] Appl. No.: 320,433

[22] Filed: Mar. 3, 1989

Related U.S. Application Data

[62] Division of Ser. No. 129,210, Dec. 7, 1987.

[51] Int. Cl.$^4$ .............................................. H01J 40/14
[52] U.S. Cl. .................................. 250/578; 250/213 A
[58] Field of Search ........................... 250/213 A, 578; 324/77 A, 77 K, 158 R

[56] References Cited

U.S. PATENT DOCUMENTS

| | | | |
|---|---|---|---|
| 3,278,846 | 10/1966 | Patten et al. | 324/77 A |
| 4,681,449 | 1/1987 | Bloom et al. | 324/77 K |
| 4,712,057 | 12/1987 | Pau | 324/158 R |
| 4,745,361 | 5/1988 | Nees | 324/77 K |

OTHER PUBLICATIONS

David H. Auston, "Impulse Response of Photoconductors in Transmission Lines," IEEE J. Quantum Electron, vol. QE-19, No. 4, 639–647 (Apr. 1983).

William R. Eisenstadt et al., "On-Chip Picosecond Time—Domain Measurements for VLSI and Interconnect Testing Using Photoconductors," IEEE Trans. Electron Devices, vol. ED-32, No. 2, 364–369 (Feb. 1985).

Primary Examiner—David C. Nelms
Assistant Examiner—Stephone B. Allen
Attorney, Agent, or Firm—Milton D. Wyrick; Paul D. Gaetjens; Judson R. Hightower

[57] ABSTRACT

A pulse generator for characterizing semiconductor devices at millimeter wavelength frequencies where a photoconductive circuit element (PCE) is biased by a direct current voltage source and produces short electrical pulses when excited into conductance by short laser light pulses. The electrical pulses are electronically conditioned to improve the frequency related amplitude characteristics of the pulses which thereafter propagate along a transmission line to a device under test.

5 Claims, 3 Drawing Sheets

PHOTOCONDUCTIVE CIRCUIT ELEMENT PULSE GENERATOR

This invention is the result of a contract with the Department of Energy (Contract No. W-7405-ENG-36).

This is a division of application Ser. No. 129,210 filed Dec. 7, 1987.

BACKGROUND OF THE INVENTION

This invention relates to the field of electronic reflectometry and, more specifically, to the measurement of extremely fast time or frequency based electronic signals utilized in the testing of circuits or devices at millimeter wavelength frequencies.

It has long been common practice in the field of electronics, when seeking to characterize an unknown circuit or device, to introduce a known signal to the circuit or device and to thereafter measure the response to that signal. Often, the necessary information can be obtained through analysis of the time-varying, periodic signal reflected back toward the source of the known signal by the circuit or device under test (DUT). This reflected signal is made up of discrete frequency components which can be analyzed for information on the circuit or device.

For devices operating at millimeter wavelength frequencies, conventional testing has involved hollow waveguide measurement systems. However, these systems provide only marginal measurement accuracy because of parasitic effects associated with the waveguide to chip transition, poor circuit stability when testing circuits or devices which are active below the waveguide's cut-off frequency, and the inherent bandwidth limitations of the waveguide itself. The maximum achievable frequency band coverage with such a system is currently limited to approximately 60 GHz.

Other prior art measurement systems, involving direct connection of a signal generator to a DUT with fast sampling of the reflected and incident signals, are severely hampered by time resolution and frequency bandwidth limitations. In the case of time domain reflectometry, commercially available equipment generally is unable to achieve a time resolution better than about 25 ps. For frequency-domain measurements, commercial equipment can attain bandwidths (error corrected) of only about 26.5 GHz in a coaxial system.

Recently, significant advances have been reported concerning photoconductive circuit elements (PCE). These on-chip photoconductive semiconductor devices are characterized as exhibiting low conductance in dark conditions, and high conductance (low resistance) in the presence of light.

Photoconductive circuit elements are fabricated from semiconductive material. However, for most applications, the materials are either gallium arsenide, silicon, or indium phosphide. For microwave applications, as in the present invention, the preferred material is gallium arsenide (GaAs).

In their natural states, when subjected to incident light energy, these semiconductors undergo a change to the conductance state through the instantaneous generation of electron-hole pairs. Upon the removal of the light energy, however, these electron-hole pairs require a relatively long period to recombine and return the semiconductor material to the low conductance state. Thus, the conductance response of the material to an extremely fast pulse of light from a laser would be a pulse with an extremely fast rise time, followed by a relatively long decay time constant on the order of 100 ps.

It has been found, though, that this decay time constant can be improved through damaging the semiconductor material. This damage is effected by the addition of foreign atoms into the semiconductor, or by subjecting the semiconductor to radiation, usually in the form of alpha particles, protons, or neutrons.

These techniques reduce the decay time constant of the semiconductor by creating additional electron-hole pair recombination centers in the material. Decay time constants on the order of 1-2 ps have been attained with radiation damaged gallium arsenide PCEs when mounted directly onto a semiconductor chip as a gap in a high speed transmission line. Such an application was reported by D. H. Auston, "Impulse Response Of Photoconductors In Transmission Lines," IEEE J. Quantum Electron., QE-19, 639-647 (April 1983).

The advent of lasers capable of subpicosecond or femtosecond optical pulse widths has led to the utilization of the fast response time PCEs as pulse generators and sampling gates in response measurements. Such an application was described by W. R. Eisenstadt, "On-Chip Picosecond Time-Domain Measurements For VLSI And Interconnect Testing Using Photoconductors," IEEE Trans. Electron Devices ED-32, 364-369 (February 1985). This article deals with the use of fast switching PCEs mounted onto semiconductor substrates as gaps between sections of microstrip transmission line for use as pulse generators and sampling gates in device test procedures. In FIG. 2 of the article, several PCEs are shown located immediately downstream from the pulse generator only for the purpose of verifying their characteristics. A CPM dye laser was employed to provide the optical pulses for the PCEs.

For actual test measurement, the Eisenstadt article disclosed the arrangement illustrated in FIG. 3 of that article, where the DUT is situated between the generator PCE and a single sampler PCE. In that arrangement, the sampler PCE samples the charge from the output waveform of the DUT when stimulated into conductance by a time delayed derivative of the laser pulse used to stimulate the generator PCE, and provides output directly to a lock-in amplifier. A lock-in amplifier is basically a frequency sensitive voltmeter, well known in the art. The article does not disclose the use of PCEs for reflectance measurements.

The above-described articles of Auston and Eisenstadt are incorporated herein by reference.

Ideally, the pulse generator end of the system would be fully impedance matched to the transmission line connecting it to the DUT. In reality, unavoidable residual mismatches will always exist, which serve to re-reflect the signal reflected from the DUT. These re-reflections, and other higher order echoes, contaminate the incident pulse signal when they overlap the incident signal in time at the point of sampling.

A further problem with the prior art relates to the undesirable effects presented by parasitic interference inevitably associated with conventional on-chip implementations of PCE generator and sampling systems. Such parasitics can appreciably limit time resolution and overall bandwidth of the system, as well as introduce a frequency domain based filtering aspect into the otherwise time domain based sampling process. Parasitics have the effect of confusing the relationship between the low frequency output signal of the sampler and the actual signal on the transmission line. Parasitics can also be the cause of bothersome discontinuities on the transmission line, which can result in measurement errors.

Still further, the prior art fails to compensate for the fact that the PCE generated pulses do not resemble ideal Delta functions, but rather may be modeled as pulses with abrupt rise times and single time constant exponential decays, due to the relatively long electron-hole pair recombination period. Such a model represents a pulse whose amplitude spectrum begins to drop off at a rate of approximately 6 dB per octave for frequencies above a certain critical frequency determined by the decay time constant associated with the pulse. This causes the signal-to-noise ratio to begin to deteriorate, resulting in additional problems related to nonlinear signal interactions. Similar problems are associated with the sampling process, which must also contend with a non-Delta function at the sampling gate window.

It is an object of the present invention to provide photoconductive reflectometer equipment that will yield accurate measurement of very fast electromagnetic signals, with excellent time resolution and bandwidth.

It is a further object of this invention to provide reflectometer equipment which minimizes the effect of undesirable reflected signals and parasitic interference.

It is still a further object to provide reflectometer equipment which includes means for shaping the generated incident pulse so as to provide a usable bandwidth significantly greater than conventional equipment.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of the present invention may comprise.

A pulse generator capable of producing electrical pulses having extremely narrow pulse widths is provided which comprises a photoconductive circuit element coupled to a direct current voltage source, the photoconductive circuit element being capable of conducting the current from the voltage source in the form of extremely fast electrical pulses. A laser is focused on the photoconductive circuit element to excite the photoconductive circuit element into extremely short periods of conductance with extremely short optical energy pulses. Pulse conditioning circuitry is connected to the photoconductive circuit element to improve the frequency related amplitude characteristics of the electrical pulses and to output the pulses.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Figure 1:
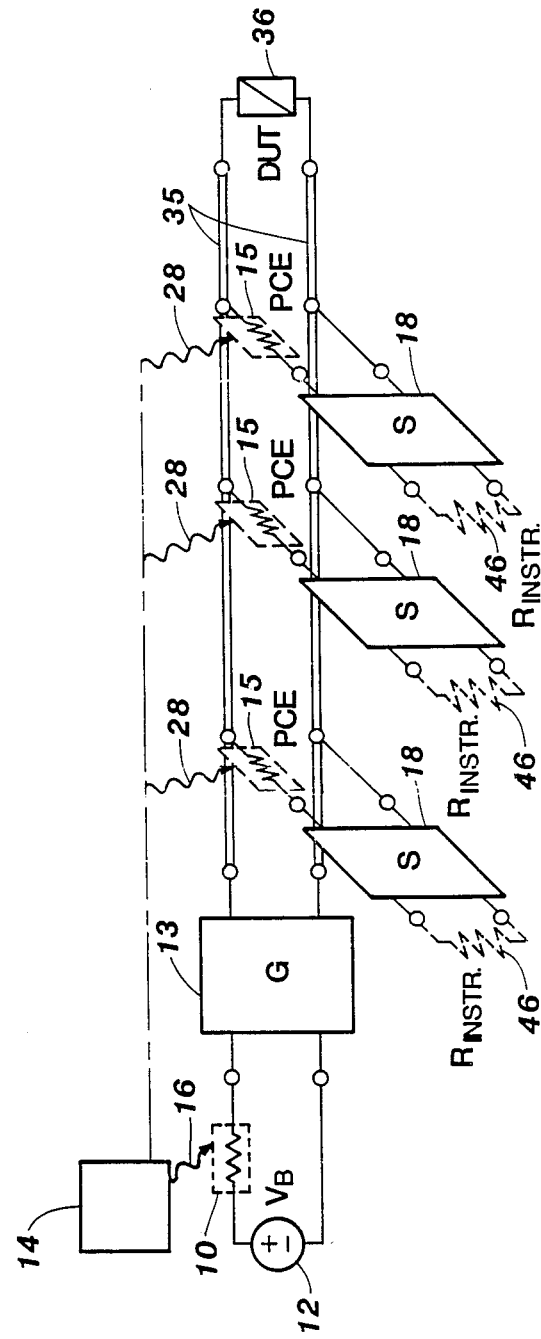
FIG. 1 is a conceptual block diagram of the photoconductive circuit element reflectometer.

Referring to FIG. 1, there is shown a conceptual block diagram of one embodiment of the present invention where PCE 10, a photoconductive circuit element, is utilized to produce a train of electrical pulses having extremely narrow pulse widths on the order of 2 ps. The preferred semiconductor material for PCE 10 is radiation damaged gallium arsenide (GaAs), although other semiconductor materials, such as silicon or indium phosphide, could be used.

PCE 10 is voltage biased by direct current voltage source 12 and connected to pulse conditioning network 13. The output of pulse conditioning network 13 is connected to transmission line 35, which, according to one embodiment, is of microstrip construction. The invention will operate as well with coaxial, coplanar waveguide, coplanar strip line, or slot line transmission lines.

Attached to transmission line 35 are three (3) sampler PCEs 15, also consisting of gallium arsenide, which are in turn connected to sampler networks 18. The output of sampler networks 18, being the processed samples of the electrical signals on transmission line 35, are connected to low-frequency recorder 46, which can take the form of any frequency-sensitive voltmeter, such as a lock-in amplifier. Where the prior art teaches the direct connection of PCEs 15 to recorder 46, the present invention utilizes the intervening circuitry of sampler networks 18 to optimally provide required low-pass filtering of the sampler PCEs 15 current response, to optimize sample PCEs 15 response in the presence of parasitic circuit elements, and to minimize parasitic disturbance of signals on transmission line 35 by he presence of the sampler networks 18 structures.

Additionally, each sampler network 18 provides a low impedance radio-frequency path to ground so that substantially the entire time-varying, periodic signal to be sampled appears across the corresponding sampler PCE 15. The outputs of each sampler network 18 provide a slowed-motion image of the signals on transmission line 35. This slowed-motion image contains all of the information necessary to reconstruct the sampled electrical signals.

Transmission line 35 terminates at device under test (DUT) 36, which is the semiconductor device or circuit to be analyzed. In one embodiment of this invention, all of the components, including the DUT, are mounted onto a single semiconductor chip.

Operation of the PCE reflectometer is initiated by a train of extremely fast (femtosecond range) laser light pulses 16, having pulse widths in the range of 100 fs and spaced a few nanoseconds apart in time, from laser 14. These optical pulses 16 are focused on PCE 10, which in response becomes conductive for extremely short periods amounting to a few picoseconds, assuming a radiation-damaged PCE 10. The extremely short conductance periods of PCE 10 generate electrical pulses related to the energy furnished by voltage source 12.

These electrical pulses (not shown) are shaped by pulse conditioning network 13 in a manner sufficient to compensate for the natural high frequency roll-off of the pulses. The compensation provided by pulse conditioning network 13 serves to flatten the amplitude envelope associated with the pulse, thus achieving a frequency response that is essentially flat well beyond the cut-off frequencies of conventional PCE based pulse generators. Pulse conditioning network 13 additionally impedance matches PCE 10 to transmission line 35 and minimizes parasitic disturbances.

The train of derivative laser pulses 28, spaced apart in time a variable period with respect to pulses 16, shown emerging from a broken line from laser 14, are derived through lengthening the path of a second synchronous laser beam from laser 14 by reflection from mirrors. These time delayed derivative laser pulses 28 also have extremely short pulse widths in the range of 100 fs and are focused on sampler PCEs 15. In response to the stimulation from derivative pulses 28, PCEs 15 repeatedly become conductive for extremely short periods of time amounting to a few picoseconds, thereby opening sampling windows for admission of samples of the time-periodic signals existing on transmission line 35 at the time of each derivative pulse 28. The time-periodic signal information admitted, which may be represented by a spectrum of discrete frequency components, is passed through sampler networks 18 to low frequency recorder 46. Sampler networks 18 minimize perturbation of the signals being sampled, and provide low-pass filtering required as part of the overall sampling process. It should be noted that derivative pulses 28 could be generated by one or more lasers in addition to laser 14, but operating in cooperation with laser 14.

Figure 2:
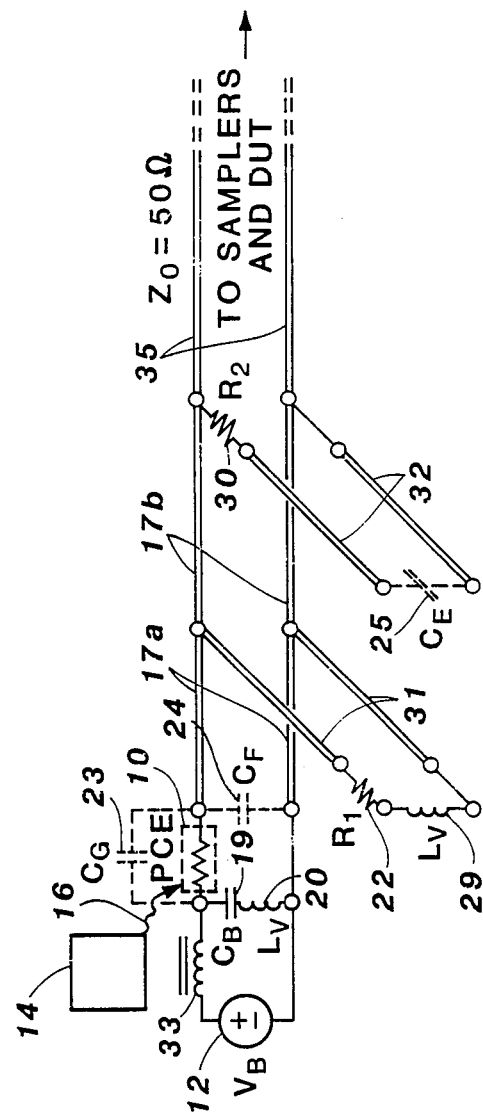
FIG. 2 is an equivalent circuit diagram of the pulse generator and conditioning network of the photoconductive circuit element reflectometer.

Pulse conditioning network 13 is shown in equivalent schematic detail in FIG. 2, along with PCE 10. The component values indicated in FIG. 2 are associated with the described embodiment, and not in limitation, and relate to a reflectometer having a usable bandwidth to approximately 160 GHz.

As illustrated in FIG. 2, PCE 10 is voltage biased by direct current voltage source 12 through rf choke 33, whose purpose is to prevent any radio frequency signals from flowing back through voltage source 12. A 10 pF blocking capacitance 19 is connected to the series connection of voltage source 12 and rf choke 33 and to 0.02 nH inductance 20, the inherent inductance resulting from the plating of the grounding hole through the substrate, also referred to as via hole inductance 20.

Parasitic gap capacitance 23 is shown in dashed lines across PCE 10 and represents the parasitic capacitance created by the gap between conductors associated with PCE 10. In like manner, parasitic fringe capacitance 24 is shown in dashed lines across transmission line segment 17a at its connection to PCE 10. Capacitance 24 represents the parasitic capacitance resulting from the proximity of the elements of transmission line segments 17a and 17b, and of transmission line 35.

Transmission line segment 17a has an impedance of 100Ω and a length of 0.0038 in. between its connection to PCE 10 and the connection of transmission line segment 31. Transmission line segment 31 has an impedance of 100Ω and a length of 0.006 in. and terminates at the series connection of 75Ω resistance 22 and via hole inductance 29, having an inherent inductance of 0.02 nH.

Transmission line segment 17b is connected to the junction of transmission line segments 17a and 31, and has a characteristic impedance of 100Ω and a length of 0.004 in. to the connection of 25Ω resistance 30 which is connected to transmission line segment 32. Transmission line segment 32 has an impedance of 100Ω, a length of 0.004 in., and is not terminated except for the effects of parasitic end capacitance 25. The connection of resistance 30 to transmission line segment 32 defines the output of pulse conditioning network 13 (FIG. 1) and is the point of attachment of main transmission line 35, which has a characteristic impedance of 50Ω.

The above-described circuitry is effective to produce a train of extremely short electrical pulses when excited by a train of extremely short optical energy pulses 16 from laser 14. The repetition frequency of the electrical pulses from PCE 10, $f_p$, coincides with the frequency of laser 14 and is, for most applications, in the vicinity of 100 MHz. The conductance of PCE 10, $g_p(t)$, can be approximated by the following expression:

$$g_p(t) = G_p * e^{-t/\tau_p}, \quad N/f_p \leq t < (N+1)/f_p; \qquad (1)$$

where $G_P$ is the peak conductance of radiation-damaged PCE 10, and $\tau_p$ represents its electron-hole pair recombination time constant. Neglecting the effect of the parasitic capacitances of the embodiment, the incident voltage on transmission line 35, $V_{inc}(f)$, represented in the frequency domain, is approximately given by:

$$V_{inc}(f) \simeq V_B \cdot R_o \cdot G_p \cdot f_p \cdot \tau_p \cdot \sum_{n=(-\infty)}^{+\infty} \left\{ \delta(f - nf_p) \cdot \sum_{k=0}^{+\infty} (-R_o \cdot G_p)^k / (k + 1 + j2\pi n f_p \tau_p) \right\}; \qquad (2)$$

where $R_o$ is the characteristic impedance of transmission line 35, and $V_B$ is the voltage provided by direct current voltage source 12. Where $1/G_P$ is considerably larger than $R_o$, the usual case, only the lowest order term in the summation over k needs to be retained.

Thus, the frequency spectrum of the incident pulses, absent pulse conditioning network 13, consists of individual components spaced $f_p$ apart, having a low-pass type amplitude envelope that drops off at a rate of 6 dB per octave beyond the critical frequency determined by the equation:

$$f_c = 1/(2\pi \tau_p). \qquad (3)$$

Figure 3:
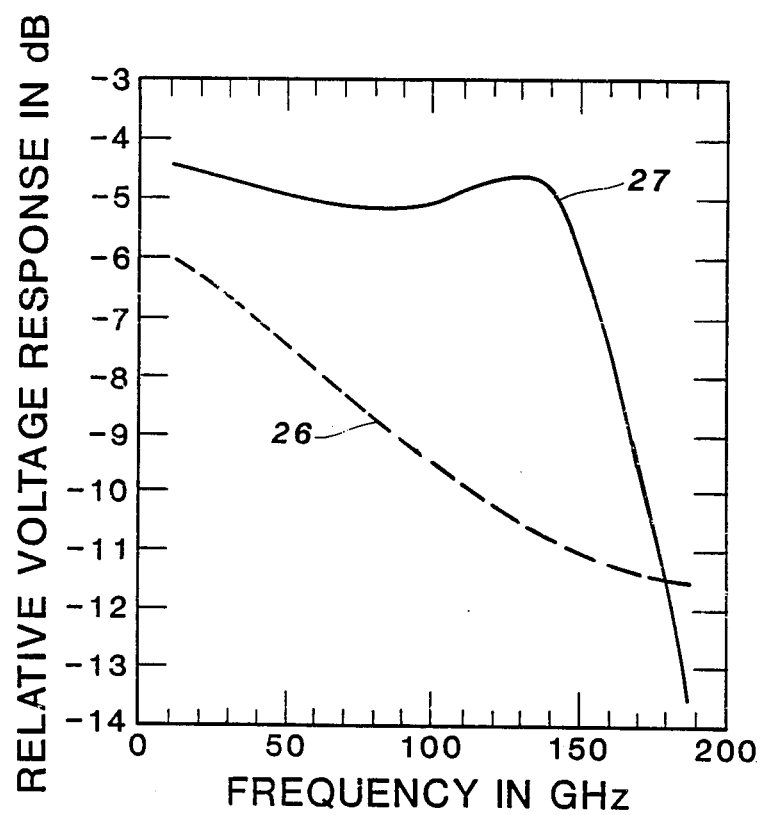
FIG. 3 is a graph comparing the frequency envelope responses of an unconditioned photoconductive circuit element pulse (broken line) to that of a conditioned pulse (solid line).

The effectiveness of pulse conditioning network 13 in overcoming this roll-off is illustrated in FIG. 3. the relative voltage response (in dB) of the electrical pulse generated by light modulated PCE 10 is plotted versus frequency (in GHz) for cases with and without pulse conditioning network 13. Dashed line curve 26 represents the envelope frequency response of the pulse without the conditioning provided by pulse conditioning network 13. Solid line curve 27 represents the envelope frequency response of the pulse after conditioning. As shown, pulse conditioning network 13 is effective in extending the frequency response of the reflectometer to approximately 160 GHz.

Numerous physical configurations could accommodate the present invention. However, it lends itself most effectively to microchip technology. The deposition of PCE 10 and PCEs 15, pulse conditioning network 13, sampler networks 18, microstrip transmission line 35, and device under test 36 all directly onto a semiconductor chip provides an extremely effective measuring device whose overall size is primarily dictated by the lowest frequency to be utilized.

It should be noted that this invention is not limited to microstrip configurations, but is applicable equally well to other types of transmission lines, such as coplanar waveguide, coplanar stripline, or slot line, mounted on a chip capable of accommodating the PCEs and the particular DUT. The use of coaxial transmission line is also possible. It should also be recognized that the invention is not only applicable to reflection measurements, but is useful in the measurement of the transmission characteristics of two port devices simply by a rearrangement of the locations of the sampler PCEs.

The foregoing detailed description of the embodiments of the present invention has been presented for purposes of illustration and description and is not intended to be exhaustive or to limit the invention to the precise form disclosed. It was chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A pulse generator capable of producing electrical pulses having extremely narrow pulse widths, comprising:

voltage means for providing a direct current voltage and current;

a photoconductive circuit element coupled to said voltage means effective to conduct the current provided by said voltage means in the form of extremely fast electrical pulses;

laser means focused on said photoconductive circuit element for exciting said photoconductive circuit element into extremely short periods of conductance with extremely short optical energy pulses;

pulse conditioning means connected to said photoconductive circuit element for improving the frequency related amplitude characteristics of said electrical pulses, and for outputting said electrical pulses.

2. The pulse generator according to claim 1, wherein said extremely short periods of conductance comprise approximately 2 ps and said extremely short optical energy pulses comprise pulse widths of approximately 100 fs.

3. A pulse generator as described in claim 1 wherein said photoconductive circuit element is comprised of radiation damaged gallium arsenide.

4. A pulse generator as described in claim 1 wherein said pulse conditioning means further comprises means for matching the impedance of said photoconductive circuit element to a transmission line connected to said matching means.

5. A pulse generator as described in claim 4 wherein said pulse conditioning means further comprises means for absorbing electrical signals reflected back toward said photoconductive circuit element.

* * * * *